United States Patent [19]
Covert et al.

[11] Patent Number: 5,158,645
[45] Date of Patent: Oct. 27, 1992

[54] METHOD OF EXTERNAL CIRCUITIZATION OF A CIRCUIT PANEL

[75] Inventors: Kathleen L. Covert, Kirkwood; Charles C. Emmons, Endicott, both of N.Y.; Elizabeth Foster, Friendsville, Pa.; Richard W. Malek, Johnson City; Voya R. Markovich, Endwell, both of N.Y.; Stephen L. Tisdale; Charyl L. Tytran, both of Vestal, N.Y.

[73] Assignee: International Business Machines, Inc., Armonk, N.Y.

[21] Appl. No.: 754,106

[22] Filed: Sep. 3, 1991

[51] Int. Cl.⁵ .................... B44C 1/22; C23F 1/00
[52] U.S. Cl. ................... 156/645; 156/656; 156/659.1; 156/661.1; 156/666; 156/902
[58] Field of Search ......... 156/645, 656, 659.1, 156/661.1, 666, 901, 902, 631; 29/846, 852; 427/96, 97, 98; 204/15

[56] References Cited

U.S. PATENT DOCUMENTS

| | | | |
|---|---|---|---|
| 3,948,701 | 4/1976 | Fasbender et al. | 156/645 X |
| 4,162,932 | 7/1979 | Konicek | 156/630 |
| 4,374,868 | 2/1983 | Stahl et al. | 427/97 |
| 4,398,993 | 8/1983 | Hume et al. | 156/631 X |
| 4,421,586 | 12/1983 | Bargman | 156/247 |
| 4,466,849 | 8/1984 | Dantsker | 156/248 |
| 4,574,031 | 3/1986 | Dorey et al. | 156/655 |
| 4,605,344 | 8/1986 | Hartmann | 408/95 |
| 4,670,335 | 6/1987 | Grah | 428/355 |
| 4,704,791 | 11/1987 | Chellis et al. | 29/852 |
| 4,728,568 | 3/1988 | Sasada | 428/349 |
| 4,917,926 | 4/1990 | Weinhold et al. | 428/40 |
| 4,964,948 | 10/1990 | Reed | 156/656 X |

FOREIGN PATENT DOCUMENTS 3319351 11/1984 Fed. Rep. of Germany .
8803477 5/1988 PCT Int'l Appl. .

Primary Examiner—William A. Powell
Attorney, Agent, or Firm—Richard M. Goldman

[57] ABSTRACT

A strippable thin film of Cu is applied above the surface features of a microelectronic circuit package to protect the features during mechanical working, for example drilling, the panel. The thin film is then stripped off of the panel. The thin film may be stripped off of the panel either prior to or after circuitization.

38 Claims, 4 Drawing Sheets

METHOD OF EXTERNAL CIRCUITIZATION OF A CIRCUIT PANEL

FIELD OF THE INVENTION

The invention relates to printed circuit boards, cards, and panels for electronic systems and devices, and more particularly to a method of fabricating the boards, cards, and panels. In fabricating printed circuit panels, a protective layer of an adhesive tape has heretofore been applied to the external surface of the panel during drilling, e.g., to protect the surface morphology. After drilling, the adhesive tape has been removed, for example with organic solvents. According to the invention, the adhesive tape is replaced by a strippable thin film of Cu deposited on the surface of the printed circuit panel. The vias and through holes are drilled through this strippable thin film of Cu and the underlying printed circuit panel. Thereafter the strippable thin film of Cu is removed, for example, to uncover the surface morphology.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y. (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

In the fabrication of packages, it is frequently necessary to use a mask, as an adhesive tape mask, to protect the underlying features during electroplating, etching, and mechanical processes. The mask has heretofore been a removable adhesive mask. The use of removable masking, as an electroplating mask, as an etching mask, and as a drilling mask.

U.S. Pat. No. 4,917,926 (Corresponding to European Patent 292304) of L. Weinhold and J. D. McDonough for Pressure sensitive adhesive masking tape for electronic components describes a pressure sensitive adhesive masking tape useful as a masking material for electronic components. The tape described therein can be used even when the component is subject to a high temperature fabrication or operation. The tape has a polymer film backing. The film and adhesive are both resistant to temperatures of up to about 250 degrees C. for up to about 5 seconds, both the adhesive and the tape require fluorocarbon solvents for post fabrication removal.

The polymer film comprises a $C_{3-6}$ polyalkyl, e.g. a polybutyl, a polymethacrylate, or copolymer with a $C_{1-2}$ alkyl methacrylate, ethyl cellulose or polyvinyl pyrrolidone, containing up to about 90 weight percent plasticiser.

The adhesive is polyacrylate based and is covered with a release layer, which requires a $C_2Cl_3F_3$ CFC solvent.

European Patent 333,722 (Corresponding to Japanese Patent 90-501390) to Flifford for Adhesive laminate for masking tape comprises latex impregnated paper describes a pressure sensitive adhesive laminate of latex-impregnated Kraft paper. The laminate has a pressure sensitive adhesive layer on one face and a polymer film on the other face. The polymer film has been applied to the paper from the liquid molten state.

The laminate is described as being useful as a masking tape for printed circuit boards during soldering, e.g. air-level soldering. This is because the polymer film does not shrink or cure at the edges during soldering.

U.S. Pat. No. 4,728568 (Corresponding to Japanese Patent 62-93999) assigned to Dainippon Screen and Sanyo Pulp for Water removable masking tape filling through holes on circuit boards describes a water soluble masking tape of a water soluble paper base with a water soluble acrylic ester copolymer adhesive agent which has been softened with a polyethylene glycol derivative.

The masking tape is used in a process of filling through-holes in a printed circuit board with a filler material during fabrication. The tape is formed of a water-soluble paper as the tape base, with a water-soluble adhesive agent applied to one side of the paper. In a preferred exemplification the adhesive comprises 100 parts of a (meth)acrylic acid resin as the adhesive constituent, blended with 50-150 parts of a polyethylene glycol derivative, serving as a hydrophilic softening constituent.

As described therein, the masking tapes are used in the production of printed circuit boards having electrically conductive layers on both sides, with through holes both connecting the conductive layers to provide electrical contact therebetween, and serving as positioning holes to position the substrate in a desired position. The positioning holes and peripheral edges of the substrate are covered with the water-soluble masking tape, while the through holes are filled with a filling material which is hardened in place. Any excess or undesirably located filling material is removed form the substrate together with the tape by applying water.

U.S. Pat. No. 4,605,344 (Corresponding to European Patent 135852, German Patent DE 3333978, and Japanese Patent 60-085807) to G. Hartmann for Drilling machine for PCBs and PCB stacks describes a device including a drill spindle with drill bit, a clamping mechanism to engages the circuit panel adjacent the location of the hole being drilled and for holding the workpiece during the drilling operation. A cover tape is positioned on the surface of the circuit panel beneath the drill bit and clamping mechanism. This cover tape protects the uppermost layer of the stack.

German Patent DE 3319351 to H. H. Merkenschi and F. Nachtrub for Circuit board with gold-plated contact fingers describes a fabrication process where the circuit board is first covered with an etch-resistant photo-foil and a printing machine is used to form the contacts and conductor pattern by photolithography. A solder-stopping covering is then applied leaving the lands, pads, and solder balls free. The lands and pads are then covered with an adhesive tape and the circuit board is provided with a liquid resist and dried.

The adhesive tape is then removed, the lands and pads are electroplated with gold, and the liquid resist is removed. The lands and pads are then covered with solder stopping lacquer. The solder balls are reflowed, hot tin-plated and washed. The stopping lacquer is finally removed from the contact fingers and the circuit board passed on for further processing, e.g., mechanical processing.

U.S. Pat. No. 4,466,849 to E. Dantsker for Masking tape removal process describes a masking tape removal process using rollers mounted for rotation about an axis parallel to the surface of the PC board. Each roller is initially provided with an adhesive outer layer or band carried about its periphery. The surface of the PC board is moved past the roller, with the roller adhesive layer in registry with the tape layer to be removed, and in pressure contact with it. This is described as causing the tape outer surface to be adhered to the roller adhesive band and removed from the surface by winding on the roller periphery.

Removal of the tape is described to be expedited by providing a release agent on a localized area of the surface of the circuit panel. Alternatively, removal can be enhanced by using an adhesive tape including a localized area of only mildly adherent adhesive.

The end of the tape is said to be lifted from the surface by adhesion to the roller adhesive band.

U.S. Pat. No. 4,421,586 to R. Arthur Bargman for Pressure sensitive tape masking and stripping by wrapping over edge clip to facilitate slitting before removal describes a masking tape that is applied to and removed from opposite sides of a planar body by installing a masking preform on one edge. The preform has a pair of sides deflected to give a spring fit. The tape is applied by wrapping the tape about the edge and over the preform and its sides, then severing the preform and tape along the edge, and stripping the severed lengths by lifting off the ends overlying the preform sides and pulling the tape free from the sides.

The method is described to be particularly useful for masking printed circuit boards during contact electroplating. The preform is described as being formed of a thin polyester film that is formed into a clip. For stripping the tape off after electroplating, the leading edge of a board is introduced between a pair of opposed rollers, each such roller carrying a band of adhesive. This band of adhesive is brought into pressure contact with the tape lengths which together with the clips adhere to the bands and are wound up on the rollers, thereby removing the adhesive tape.

U.S. Pat. No. 4,670,335 (Corresponding to European Patent EP 81770, Japanese Patent Document JP 58-107494, German Patent Documents DE 3210288-A and DE 3277973-G, and Canadian Patent Document CA 1204349) to K. Grah for Masking tape for electroplating processes bearing heat-activated adhesive mixt. of plastomer, hard resin, and plasticiser describes masking tape for partial coverage of objects being electroplated, such as, conductor plates. The tape is not self-adhesive, but is heat activated. The tape has a carrier of paper or film coated with a mixt. of a plastomer, a hard resin, and a plasticiser. The paper is a soluble cellulose derivative., for example, ethylcellulose or cellulose acetobutyrate, or a vinyl polymer, such as, polyvinyl acetate. The plastomer is a maleinate, benzoate, or terpene resin, or a natural resin. The hard resin is described as being a phthalate, an adipate, or a soft resin, for example, a hydrogenated ester or a liquid urea resin. The mixture comprises 10-60 weight percent of the plastomer, 70%–30 wt.% of the resin, and remainder is plasticizer.

The papers described therein are not self-adhesive at room temperature and can be easily moved to correct positioning. They become adhesive on heating to about 100–140 degrees C., when the plastomer softens and the resin melts, to prevent influx of liquid underneath the paper.

German Patent DE 3149282-C for Masking tape for electroplating e.g. of PCB having film base with adhesive coat of plasticised hard resin also describes a masking tape used in electroplating printed circuit boards. The tape consists of a film base with a plasticized, maleic acid or carbamide hard resin adhesive coat on one side.

The above described processes, while protecting the surface morphology of circuit cards and boards, that is, panels, during drilling of vias and through holes, introduce organic adhesives and/or organic solvents into the processing environment. Many of these organic adhesives and organic solvents are incompatible with existing panel fabrication coatings, layers, materials, and processes.

Two documents describe protective plated surfaces.

U.S. Pat. No. 4,704,791 (Corresponding to European Patent EP 235701-A, Japanese Patent Document JP 62-206897-A, Australian Patent AT 87-69674-A, and Canadian Patent CA 1245774-A) to L. Chellis and T. Ellis for Forming land-less through-hole connection describes a process for forming a landless connection by forming and plating the through holes in presence of a temporary conductor pattern support inside of the dielectric. In the described process landless through hole connections are drilled through a support layer of a thick metal and a release layer of a thinner metal. More particularly, the conductors are connected through a dielectric by providing the dielectric layer with a conductive pattern on one surface covered by a temporary support layer; forming a second conductive pattern on the opposite surface, also with a temporary support layer covering it; forming the through-holes between the conductive patterns on the opposite faces of the substrate; plating the through holes to form the connections between the connections; and peeling away the temporary support layers to landless connections between the patterns. Thus, the metal support layer is used as a cathode, to be stripped away, leaving behind a landless through hole.

U.S. Pat. No. 4,574,031 to J. K. Dorey, J. T. Huneke, B. S. Madsen, and T. F. Schaaf for ADDITIVE PROCESS ELECTROLESS METAL PLATING USING AQUEOUS PHOTORESIST describes a method for producing drilled holes in circuit panels and then cleaning and sensitizing the surface. The sensitization layer is plated in the holes as well as on the surface. The process includes applying a photoresist to the substrate to delineate the desired pattern; etching the exposed substrate surface; washing in reducing media to reduce and remove chrome from the substrate surface; catalysing the substrate surface; and electrolessly depositing a thin flash metal coating; then stripping the photoresist mask and any overlying catalyst and flash plate to leave a flash plate pattern on the substrate.

These two plating processes are not related to masking during mechanical working.

OBJECTS OF THE INVENTION

It is an object of the invention to overcome the deficiencies of the prior art.

It is a further object of the invention to protect the surface morphology of circuit cards and boards, that is, panels, during drilling of vias and through holes.

It is a further object of the invention to protect the surface morphology of circuit cards and boards during drilling of vias and through holes without introducing organic adhesives and/or organic solvents into the processing environment.

It is a still further object of the invention to protect the surface morphology of circuit cards and boards during drilling of vias and through holes using protective coatings, layers, materials, and processes that are compatible with existing panel fabrication coatings, layers, materials, and processes.

It is a still further object of the invention to provide a process for drilling high aspect ratio, fine diameter holes. These include through holes that are, for example, less than 3 mils in diameter, through a thick substrate, for example, 30 or more mils thick, having an aspect ratio in excess of 10.

SUMMARY OF THE INVENTION

The invention overcomes the deficiencies of the prior art and achieves the above objects, by avoiding the use of adhesive tape protective layers during drilling of vias and through holes. Organic adhesive tape has heretofore been used to protect the package surface morphology from damage during drilling of vias and through holes. This adhesive tape, also referred to as "Drill Mask Tape," requires the use of organic solvents to remove adhesive residue.

According to the method of the invention, a strippable metallic protective layer is applied to the surface of the circuit panel to protect the surface morphology of the panel for further processing. After this metallic protective layer is applied to the panel, the through holes are drilled through the metallic protective layer into the panel. The drilled through holes are conventionally cleaned, and the metallic protective layer may then be removed, and circuitization carried out. Alternatively, the thin metallic protective layer may be kept to provide a base or seed layer for circuitization, and removed after circuitization is completed. Circuitization includes both surface circuitization of the panel and plating the through holes.

The metallic protective layer is typically a strippable thin film of Cu that is applied to the surface of the printed circuit panel. Drilling is carried out while this Cu thin film is in place. That is, the through holes are drilled through the strippable thin film of Cu and into and through the printed circuit panel. After the through holes are drilled and cleaned, the Cu thin film protective layer is removed, for example by etching the strippable thin film of Cu. This uncovers the heretofore protected surface morphology.

Alternatively, the Cu thin film protective layer may be kept in place until after circuitization is complete. For example, the Cu thin film protective layer could remain on the panel when the panel is to contain Cu inner planes sensitive to etch back, or which are to be electroplated.

The copper deposit, while thin, is thick enough to protect surface features of the panel during drilling. Thus, according to the method of the invention, drill mask tape, such as a polyester tape, is eliminated, the strippable Cu thin film serving as a protective layer for the substrate during drilling. Moreover, the high thermal conductivity of the copper thin film allows the copper to function as a heat transfer medium, and even as a heat sink, during drilling. In a particularly preferred exemplification of the invention the thickness of the copper is controlled to optimize the heat transfer and heat sink effect of the Cu film.

According to the method of the invention it is possible to protect the surface morphology of circuit cards and boards, that is, panels, during drilling of vias and through holes without introducing organic adhesives and/or organic solvents into the processing environment. This is accomplished by using only protective coatings, layers, materials, and processes that are compatible with existing panel fabrication coatings, layers, materials, and processes, for example Cu.

THE FIGURES

The invention may be understood by reference to the FIGURES appended hereto.

DETAILED DESCRIPTION OF THE INVENTION

The invention provides a method of fabricating a printed circuit panel where the use of adhesive tape protective layers is avoided. It has heretofore been necessary to use layers of organic adhesive tape to protect the surface morphology from damage during drilling of vias and through holes. This adhesive tape, referred to as "Drill Mask Tape," introduces incompatible chemical processing steps, including the use of organic solvents to remove adhesive residue. Moreover, for fine grid drilling, that is, drilling 4 to 10 mil diameter through holes on a grid of 20 mils or less, with an aspect ratio of 9:1 or more, "Drill Mask Tape" introduces defects.

According to the method of the invention it is possible to drill small diameter through holes, for example from less than 3 mils in diameter to 10 or mils in diameter, on a fine grid, for example a grid of 20 mils or less, and having high aspect ratios, for example, aspect ratios of 9:1 or 10:1 or higher, through thick substrates, without protective tape. According to one preferred exemplification of the invention, 3 mil through holes are drilled through a 30 mil substrate, without protective tape.

According to the method of the invention a metallic protective layer is applied to the surface of the circuit panel to protect the surface morphology of the panel for further processing. After this metallic protective layer is applied to the panel, the through holes are drilled through the metallic protective layer into the panel. The drilled through holes are conventionally cleaned, for example with permanganate solution, to remove drilling debris therefrom.

Figure 1:
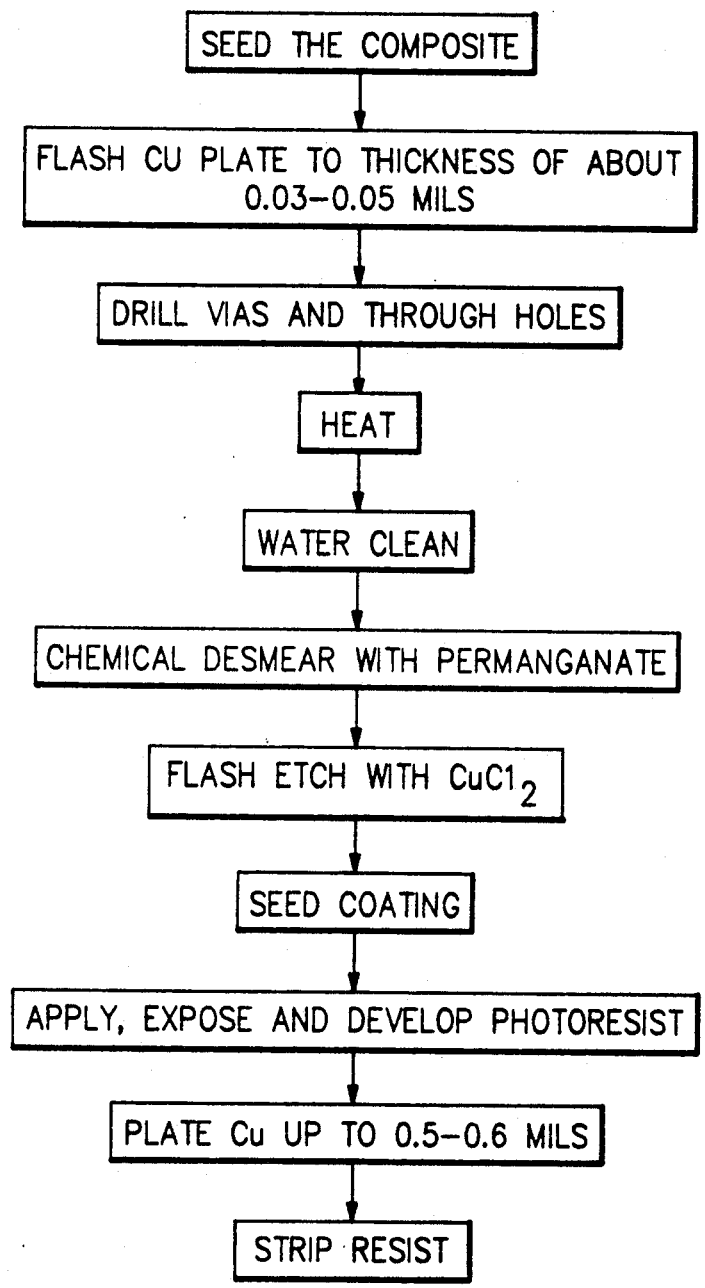
FIG. 1 is a flow chart of one exemplification of the method of the invention where the Cu thin film is removed from the panel prior to circuitization.
Figure 3:
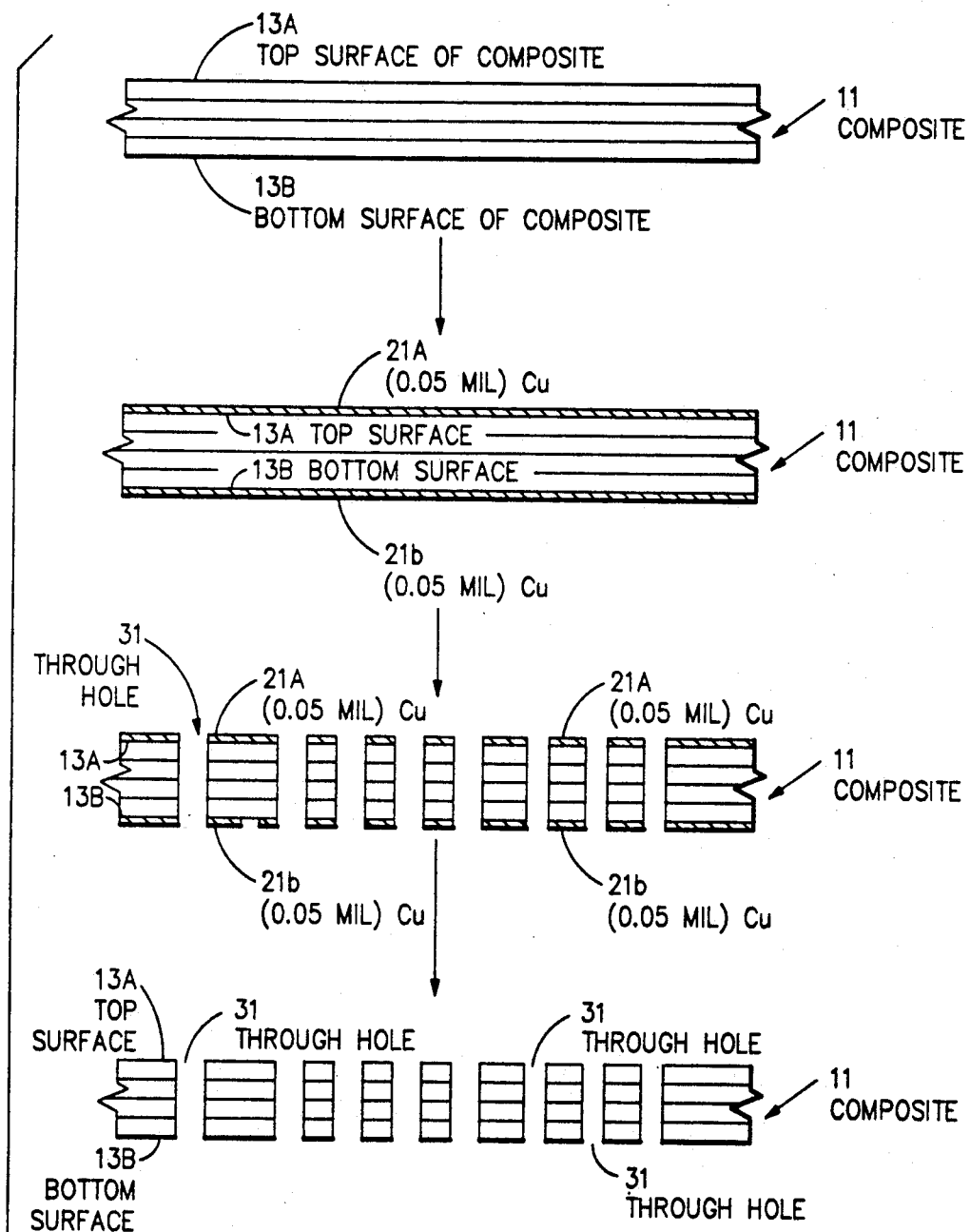
FIG. 3 is a cutaway side elevation of a portion of a panel in process in one exemplification of the method of the invention where the Cu thin film is removed from the panel prior to circuitization.

In one exemplification of the invention, shown in the flow chart of FIG. 1 and in FIG. 3, the metallic protective layer is then removed, and circuitization is carried out.

Figure 2:
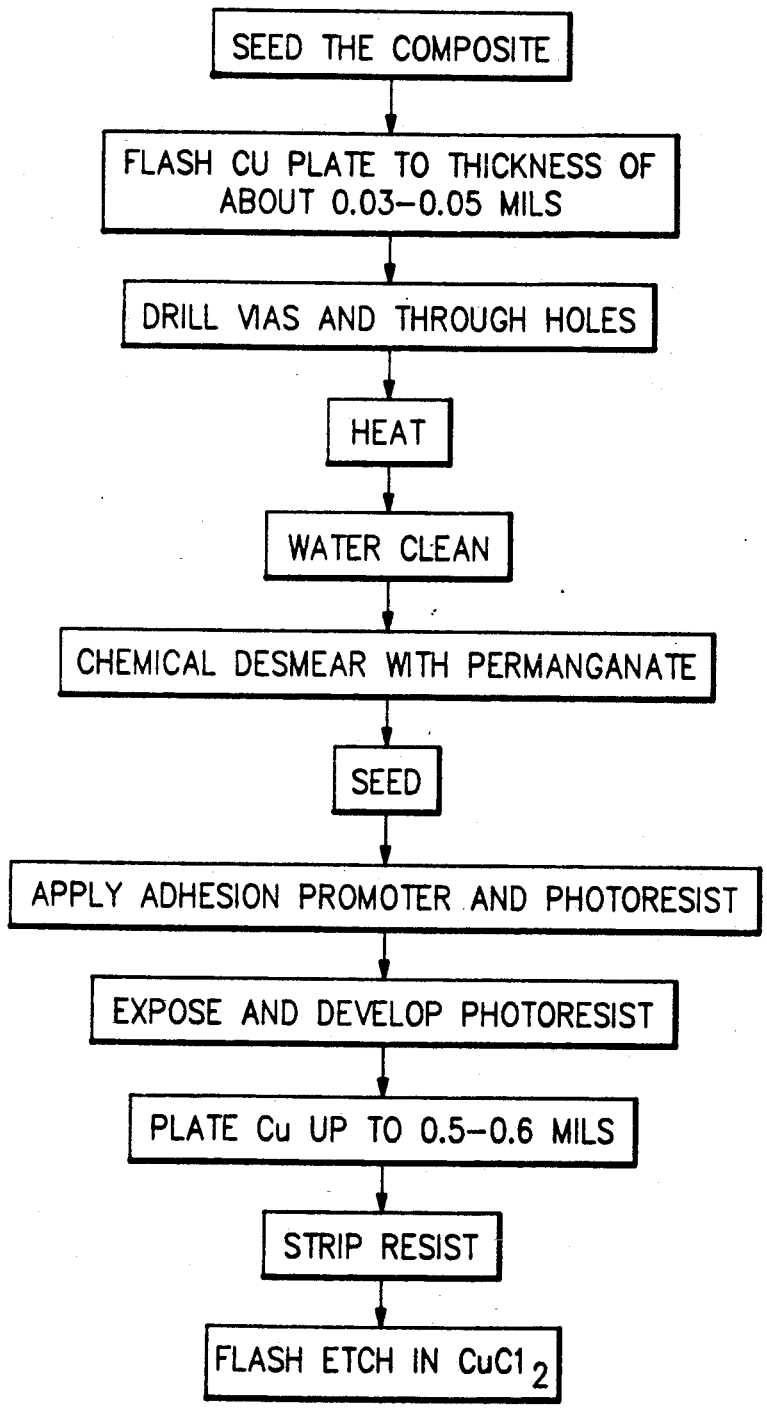
FIG. 2 is a flow chart of an alternative exemplification of the method of the invention where the Cu thin film remains on the panel during circuitization.
Figure 4:
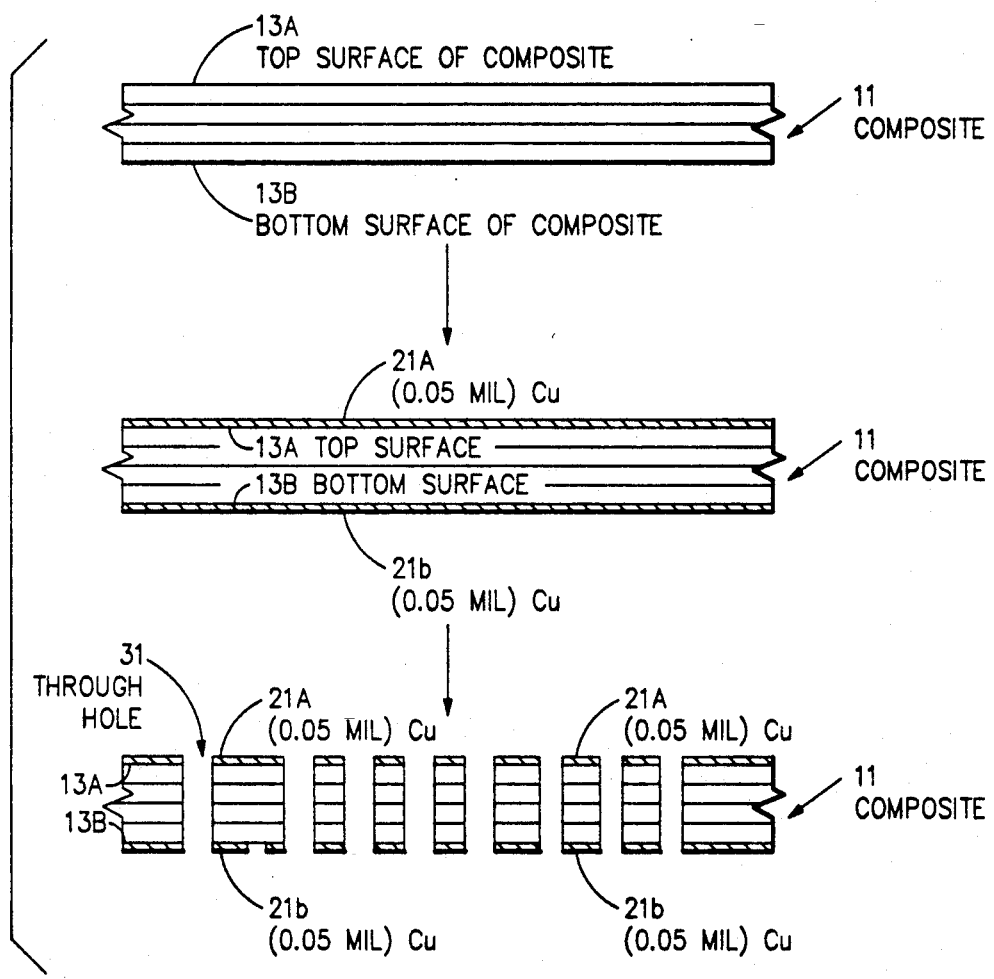
FIG. 4 is a cutaway side elevation of a portion of a panel in process in an alternative exemplification of the method of the invention where the Cu thin film remains on the panel during circuitization.

In an alternative exemplification of the invention, illustrated in the flow chart of FIG. 2 and in FIG. 4, the metallic protective layer is left in place as a base layer for circuitization. This base layer may then be removed after circuitization is complete. Circuitization includes both surface circuitization of the panel and plating the through holes.

The metallic protective layer is typically a strippable thin film of Cu that is applied to the surface of the printed circuit panel. Drilling is carried out while this Cu thin film is in place. That is, the through holes are drilled through the strippable thin film of Cu and into and through the printed circuit panel.

In one exemplification of the invention, shown in FIGS. 1 and 3, the Cu thin film protective layer is removed after the through holes are drilled and cleaned, for example by etching the strippable thin film of Cu. This uncovers the heretofore protected surface morphology.

In an alternative exemplification of the invention, shown in FIGS. 2 and 4, the Cu thin film protective layer remains on the panel after the through holes and vias are drilled, and is removed after circuitization. This uncovers the heretofore protected surface morphology.

One method of the invention is shown in the flow chart of FIG. 1, and the product is shown in FIG. 3. In the practice of the invention, the copper is applied to the dielectric surface of the circuit as the upper layer of a Cu layer—seed layer multilayer. This is because it is necessary to first apply a seed layer to the dielectric surface of the panel, and to only thereafter apply the Cu thin film. The seed layer is an electroless deposited thin film of Pd or Pd-Sn alloy. The seed layer may be deposited by (1) a two stage process in which the panel is immersed in $SnCl_2$ and then in $PdCl_2$ to thereby form the a Sn-Pd seed coating, (2) immersion in a Pd-Sn colloid, or (3) a three stage process in which the panel is immersed in $SnCl_2$, and thereafter in $PdCl_2$ to thereby form an activated Sn-Pd coating, and thereafter immersed in a Pd-Sn colloid to form the seed layer. The seed layer is deposited to a thickness of from about 10 Angstroms to about 50 Angstroms.

The Cu thin film layer is deposited atop the thin film seed layer. The protective thin film of Cu is thick enough to protect the surface morphology of the circuit panel. This is a Cu thin film thickness of from about 0.03 to 0.05 mil. The thin Cu film may be deposited by electroless plating, for example, from an alkaline copper solution, or by electroplating.

The copper deposit, while thin, is thick enough to protect surface features of the panel during drilling. After drilling, the panel is heated, for example to about 145 degrees C., and then washed with high pressure water and thereafter desmeared with alkaline permanganate solution, and flash etched with an suitable oxidant, as aqueous $CuCl_2$, to remove the Cu and uncover the surface morphology. This is accomplished substantially without etchback of the interplanar copper.

The flash etch in the aqueous $CuCl_2$ solution is severe enough, with the $Cu^{+2}$ catalyzing the removal of the Pd and Pd/Sn, to remove the Pd seed layer. Therefore a second Pd or Pd/Sn seed layer is applied substantially as described above.

In the case of additive circuitization, a suitable photoresist, such as DuPont T-168 is applied, exposed, and developed, to thereby selectively uncover seeded substrate in a pattern corresponding to the intended circuitization.

Cu circuitization is then applied to the uncovered Pd or Pd/Sn seed. Circuitization may be by electroless deposition or by electrodeposition. The Cu circuitization layer is about generally about 0.5 mil or more thick for internal circuitization, and generally about 1.1 mils or more thick for external circuitization. After circuitization the photoresist is conventionally stripped, and the seeding layer may be removed.

In the case of subtractive circuitization, a layer of Cu is applied to the Pd or Pd/Sn seed. This metallization may be by electroless deposition or by electrodeposition. The Cu metallization layer is about generally about 0.5 mil or more thick for internal circuitization, and generally about 1.1 mils or more thick for external circuitization.

After metallization a suitable photoresist, such as DuPont T-168 is applied, exposed, and developed, to thereby selectively uncover the copper metallization in a reversed image of the intended circuitization. The uncovered copper and seed layer thereunder are conventionally removed. Thereafter the photoresist is conventionally stripped.

A microelectronic circuit panel is shown in various stages of fabrication in FIG. 3. The panel includes a multilayer composite 11, with internal circuitization, and external surfaces 13A and 13B, including external circuitization. The external surfaces 13A and 13B are coated with a thin film, e.g., an 0.05 mil film, of Cu 21A, 21B. The vias and through holes 31 are drilled through the Cu thin film 21A, 21B into the panel 11. The Cu thin film 21A, 21B is then stripped off, leaving the exposed surfaces 13A, 13B, of the composite panel.

An alternative method of the invention is shown in the flow chart of FIG. 2, which provides the panel shown in FIG. 4. In the practice of this alternative method of the invention, the process flow up to the permanganate desmearing step is parallel to that of the exemplification shown in the flow chart of FIG. 1. However, after the permanganate desmearing step the protective layer is not removed from the panel, but remains on the panel as a base layer for subsequent circuitization. Thus, the thin, protective Cu layer serves to prevent damage and etchback of copper internal planes, as well as providing a commoning layer for pattern electroplating.

In this alternative exemplification of the invention, after chemically desmearing the through holes, it is necessary to activate the through holes prior to copper plating. Therefore, a second Pd or Pd/Sn seed layer is applied to the circuit panel prior to circuitization.

In the alternative process shown in FIG. 2, it is also necessary to modify the original seeding process to include an etching step to remove excess Pd on the surface Cu. This will prevent possible loss of adhesion between the thin Cu protective layer and the plated Cu deposited atop the Cu protective layer in the circuitization step.

In the case of additive circuitization, after deposition of the second seeding layer, a suitable resist adhesion promoter is utilized, such as benzotriazole. This resist adhesion promoter is applied to the seed layer prior to applying the photoresist, for example DuPont T168 photoresist.

The photoresist is exposed and developed to selectively uncover the seeded through holes and the thin Cu protective layer in a pattern corresponding to the intended circuitization.

Cu circuitization is then applied to both the lithographically uncovered Pd or Pd/Sn seed layer and the thin Cu layer. Circuitization may be by electroless deposition, or by electrodeposition. After circuitization the remaining photoresist is conventionally stripped, and the background of the thin protective Cu layer is removed. The thin protective layer of Cu may be removed by etching in a suitable oxidant, as $CuCl_2$.

In the case of subtractive circuitization Cu metallization is then applied to Pd or Pd/Sn seed layer atop the thin Cu protective layer. Metallization may be by electroless deposition, or by electrodeposition.

A suitable resist adhesion promoter is utilized, such as benzotriazole. This resist adhesion promoter is applied to the Cu metallization layer prior to applying the photoresist, for example DuPont T168 photoresist.

The photoresist is exposed and developed to selectively uncover the copper in a pattern corresponding a reversed image of the intended circuitization. The uncovered copper, seed layer, and copper protective layer are then removed conventionally. The photoresist is then stripped.

A microelectronic circuit panel prepared by this alternative method of the invention is shown in cutaway plan view in FIG. 4, The panel includes a multilayer composite 11, with internal circuitization and external surfaces 13A and 13B, including external circuitization. The external surfaces are coated with a thin film, e.g., an 0.05 mil film, 21A, 21B, of Cu.

The vias and through holes 31 are drilled through the Cu thin film 21A, 21B into the panel 11. The Cu thin film then remains on the external surfaces of the composite 11 as the composite enters the circuitization process.

Thus, according to the method of the invention, drill mask tape, such as a polyester tape, is eliminated, the strippable Cu thin film serving as a protective layer for the substrate during drilling. Moreover, the high thermal conductivity of the copper thin film allows the copper to function as a heat transfer medium, and even as a heat sink, during drilling. In a particularly preferred exemplification of the invention the thickness of the copper is controlled to optimize the heat transfer and heat sink effect of the Cu film. The strippable Cu thin film can be removed either before or after circuitization, depending on the sensitivity of the internal planes and the method of plating.

While the invention has been described with certain preferred embodiments and exemplifications, it is not intended to limit the scope of the invention thereby, but solely by the claims appended hereto.

We claim:

1. In a method of fabricating a printed circuit panel, which method comprises applying a protective layer to a surface of the panel to protect the surface morphology of the panel for further processing, drilling a through hole in the panel, cleaning the through hole to remove drilling debris therefrom, and circuitizing the surface of the panel and the through hole, the improvement comprising:
   a. applying a strippable thin film of Cu to the surface of the printed circuit panel;
   b. drilling the through hole through the strippable thin film of Cu and the printed circuit panel;
   c. thereafter etching the strippable thin film of Cu to uncover the surface morphology; and
   d. circuitizing the surface of the printed circuit panel.

2. The method of claim 1 comprising first etching the strippable thin film of Cu to uncover the surface morphology, and thereafter circuitizing the surface of the printed circuit panel.

3. The method of claim 1 comprising first circuitizing the surface of the printed circuit panel, and thereafter etching the exposed strippable thin film of Cu to uncover the surface morphology.

4. The method of claim 1 comprising seeding the surface of the printed circuit panel, and thereafter flash plating the strippable copper thin film to the seeded surface of the printed circuit panel.

5. The method of claim 4 comprising flash plating the strippable copper to thickness of about 0.03 to 0.05 mil.

6. The method of claim 1 comprising flash etching the strippable Cu in aqueous $CuCl_2$.

7. The method of claim 1 comprising cleaning the drilled hole and thereafter etching the thin film of Cu to uncover the surface morphology.

8. The method of claim 7 comprising cleaning the drilled hole with permanganate solution.

9. The method of claim 1 comprising cleaning the drilled hole, circuitizing the printed circuit panel, and thereafter etching the thin film of Cu to uncover the surface morphology.

10. The method of claim 9 comprising cleaning the drilled hole with permanganate solution.

11. The method of claim 1 comprising etching the strippable copper, and thereafter applying a seed layer to the surface morphology, applying photoresist atop the seed layer, exposing and developing the photoresist, applying copper atop the seed layer and photoresist, and stripping the photoresist.

12. The method of claim 11 comprising applying copper atop the seed layer and photoresist to a thickness of at least about 0.50 mil.

13. The method of claim 1 comprising etching the strippable copper, and thereafter applying a seed layer to the surface morphology, applying copper atop the seed layer, applying photoresist atop the copper, exposing and developing the photoresist, removing the uncovered copper, and stripping the photoresist.

14. The method of claim 13 comprising applying copper atop the seed layer to thickness of at least about 0.50 mil.

15. The method of claim 1 comprising desmearing a via or through hole, applying a second seed layer atop the thin protective layer, applying photoresist atop the seed layer, exposing and developing the photoresist, applying copper atop the thin protective layer and the second seed layer, and stripping the photoresist and the exposed thin protective layer and seed layer.

16. The method of claim 15 comprising applying copper atop the seed layer and photoresist to a thickness of at least about 0.50 mil.

17. The method of claim 1 comprising desmearing a via or through hole, applying a second seed layer atop the thin protective layer, applying copper atop the seed layer, applying photoresist atop the copper, exposing and developing the photoresist, removing the uncovered copper, and stripping the photoresist.

18. The method of claim 17 comprising applying copper atop the seed layer to thickness of at least about 0.50 mil.

19. A method of fabricating a printed circuit panel, which method comprises:
   a. applying a strippable thin film of Cu to the surface of the printed circuit panel to protect the surface morphology of the panel for further processing;
   b. drilling a through hole through the strippable thin film of Cu and the printed circuit panel;
   c. cleaning the through hole to remove drilling debris therefrom;
   d. etching the strippable thin film of Cu to uncover the surface morphology; and
   e. thereafter circuitizing the surface of the panel and the through hole.

20. The method of claim 19 comprising seeding the surface of the printed circuit panel, and thereafter flash plating the strippable copper thin film to the seeded surface of the printed circuit panel.

21. The method of claim 20 comprising flash plating the strippable copper to thickness of about 0.03 to 0.05 mil.

22. The method of claim 20 comprising flash etching the strippable Cu in aqueous $CuCl_2$.

23. The method of claim 19 comprising cleaning the drilled hole and thereafter etching the thin film of Cu to uncover the surface morphology.

24. The method of claim 23 comprising cleaning the drilled hole with permanganate solution.

25. The method of claim 19 comprising etching the strippable copper, and thereafter applying a seed layer to the surface morphology, applying photoresist atop the seed layer, exposing and developing the photoresist, applying copper atop the seed layer and photoresist, and stripping the photoresist.

26. The method of claim 25 comprising applying copper atop the seed layer and photoresist to a thickness of at least about 0.50 mil.

27. The method of claim 19 comprising etching the strippable copper, and thereafter applying a seed layer to the surface morphology, applying copper atop the seed layer, applying photoresist atop the copper, exposing and developing the photoresist, removing the uncovered copper, and stripping the photoresist.

28. The method of claim 27 comprising applying copper atop the seed layer to thickness of at least about 0.50 mil.

29. A method of fabricating a printed circuit panel, which method comprises:
   a. applying a strippable thin film of Cu to the surface of the printed circuit panel to protect the surface morphology of the panel for further processing;
   b. drilling a through hole through the strippable thin film of Cu and the printed circuit panel;
   c. cleaning the through hole to remove drilling debris therefrom;
   d. circuitizing the surface of the panel and the through hole; and
   e. thereafter etching the strippable thin film of Cu to uncover the surface morphology.

30. The method of claim 29 comprising seeding the surface of the printed circuit panel, and thereafter flash plating the strippable copper thin film to the seeded surface of the printed circuit panel.

31. The method of claim 30 comprising flash plating the strippable copper to thickness of about 0.03 to 0.05 mil.

32. The method of claim 30 comprising flash etching the strippable Cu in aqueous $CuCl_2$.

33. The method of claim 29 comprising cleaning the drilled hole, circuitizing the panel, and thereafter etching the uncircuitized thin film of Cu to uncover the surface morphology.

34. The method of claim 33 comprising cleaning the drilled hole with permanganate solution.

35. The method of claim 29 comprising applying a seed layer atop the protective Cu layer, applying photoresist atop the seed layer, exposing and developing the photoresist, applying copper atop the protective Cu layer, seed layer, and photoresist, and thereafter stripping the photoresist and the protective Cu layer underlying the photoresist.

36. The method of claim 35 comprising applying copper atop the protective Cu layer, seed layer and photoresist to a thickness of at least about 0.50 mil.

37. The method of claim 29 comprising etching the strippable copper, and thereafter applying a seed layer to the surface morphology, applying copper atop the seed layer, applying photoresist atop the copper, exposing and developing the photoresist, removing the uncovered copper, and stripping the photoresist.

38. The method of claim 37 comprising applying copper atop the seed layer to thickness of at least about 0.50 mil.

* * * * *